(12) United States Patent
Zhao et al.

(10) Patent No.: US 9,305,130 B2
(45) Date of Patent: Apr. 5, 2016

(54) METHOD FOR FORMING SEMICONDUCTOR LAYOUT PATTERNS, SEMICONDUCTOR LAYOUT PATTERNS, AND SEMICONDUCTOR STRUCTURE

(71) Applicant: UNITED MICROELECTRONICS CORP., Hsin-Chu (TW)

(72) Inventors: Jie Zhao, Singapore (SG); Huabiao Wu, Singapore (SG)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/445,037

(22) Filed: Jul. 28, 2014

(65) Prior Publication Data

US 2014/0337809 A1    Nov. 13, 2014

Related U.S. Application Data

(62) Division of application No. 13/471,468, filed on May 15, 2012, now Pat. No. 8,829,610.

(51) Int. Cl.
| | |
|---|---|
| *H01L 29/66* | (2006.01) |
| *G06F 17/50* | (2006.01) |
| *H01L 29/78* | (2006.01) |
| *H01L 29/417* | (2006.01) |

(52) U.S. Cl.
CPC ........ *G06F 17/5072* (2013.01); *G06F 17/5068* (2013.01); *H01L 29/41758* (2013.01); *H01L 29/78* (2013.01); *Y10T 428/24612* (2015.01)

(58) Field of Classification Search
CPC ..................... H01L 27/1104; H01L 27/11504; H01L 27/11519; H01L 27/11565; H01L 27/11587

USPC .................................. 257/335, 402, E29.256
See application file for complete search history.

(56) References Cited

U.S. PATENT DOCUMENTS

| | | | |
|---|---|---|---|
| 5,834,161 A * | 11/1998 | Bae ............................. | 430/313 |
| 6,033,811 A | 3/2000 | Lee | |
| 6,118,158 A * | 9/2000 | Kim ............................. | 257/369 |
| 6,395,438 B1 | 5/2002 | Bruce | |
| 6,470,489 B1 | 10/2002 | Chang | |
| 6,684,382 B2 | 1/2004 | Liu | |
| 6,738,958 B2 | 5/2004 | Manoo | |
| 6,753,115 B2 | 6/2004 | Zhang | |
| 6,763,514 B2 | 7/2004 | Zhang | |
| 6,852,453 B2 | 2/2005 | Wu | |
| 6,961,920 B2 | 11/2005 | Zach | |
| 7,386,829 B2 | 6/2008 | Lee | |
| 7,624,369 B2 | 11/2009 | Graur | |
| 2006/0066339 A1 | 3/2006 | Rajski | |
| 2006/0085772 A1 | 4/2006 | Zhang | |

(Continued)

FOREIGN PATENT DOCUMENTS

JP          H1093086 A          4/1998

*Primary Examiner* — Brook Kebede
(74) *Attorney, Agent, or Firm* — Winston Hsu; Scott Margo (57) ABSTRACT

A method for forming semiconductor layout patterns providing a pair of first layout patterns being symmetrical along an axial line, each of the first layout patterns comprising a first side proximal to the axial line and a second side far from the axial line; shifting a portion of the first layout patterns toward a direction opposite to the axial line to form at least a first shifted portion in each first layout pattern, and outputting the first layout patterns and the first shifted portions on a first mask.

12 Claims, 8 Drawing Sheets

(56) References Cited

U.S. PATENT DOCUMENTS

| | | |
|---|---|---|
| 2006/0161452 A1 | 7/2006 | Hess |
| 2006/0267096 A1 | 11/2006 | Maeda |
| 2009/0116282 A1 | 5/2009 | Osada |
| 2009/0127636 A1 | 5/2009 | Smayling |
| 2009/0193385 A1 | 7/2009 | Yang |
| 2009/0278569 A1 | 11/2009 | Taoka |
| 2012/0278777 A1* | 11/2012 | Lin et al. .................. 716/111 |

* cited by examiner

METHOD FOR FORMING SEMICONDUCTOR LAYOUT PATTERNS, SEMICONDUCTOR LAYOUT PATTERNS, AND SEMICONDUCTOR STRUCTURE

CROSS REFERENCE TO RELATED APPLICATIONS

This application is a divisional of application Ser. No. 13/471,468 filed May 15, 2012, and included herein by reference.

BACKGROUND OF THE INVENTION

1. Field of the Invention

The invention relates to a method for forming semiconductor layout patterns, semiconductor layout patterns and a semiconductor structure, and more particularly, to a method for forming semiconductor layout patterns, semiconductor layout patterns and a semiconductor structure having improved process window.

2. Description of the Prior Art

Increasingly complex electronic systems require increasingly denser active devices such as transistors. Accordingly, memory cells, such as SRAM cells can get smaller by shrinking the transistor. However, it is becoming more and more difficult to further reduce the size of transistors to continue shrinking.

Figure 1A:
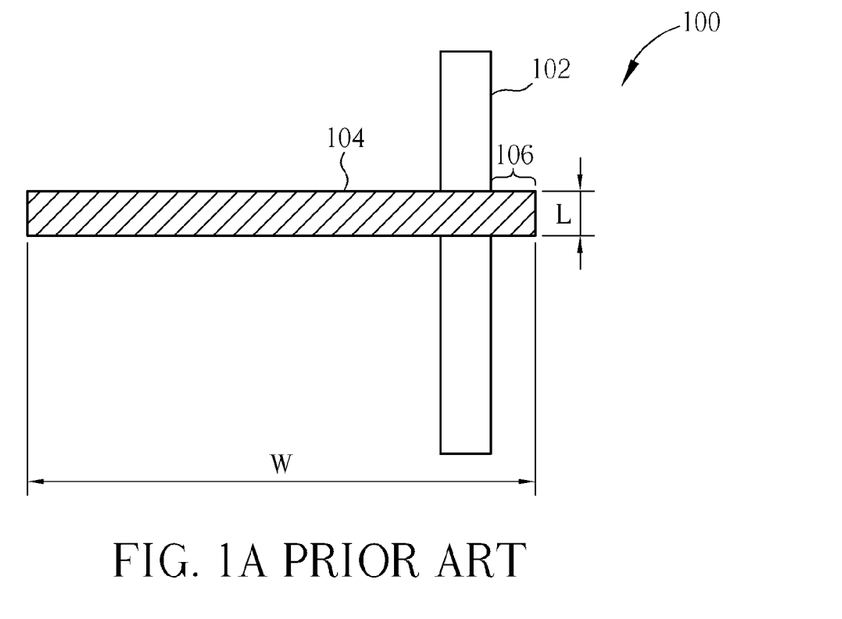
FIG. 1A shows expected layout patterns for a semiconductor device.

In conventional semiconductor processing, diffusions are typically formed in a semiconductor substrate and then gate electrodes are aligned and patterned relative to the diffusions. Please refer to FIG. 1A, which shows expected layout patterns for a semiconductor device 100. As shown in FIG. 1A, a diffusion pattern 102, which will become part of transistors is provided, and a gate pattern 104 is subsequently provided corresponding to the diffusion pattern 102. The gate pattern 104 includes an expected gate width W and an expected channel length L. It is noteworthy that a portion of gate pattern 104 must extend past the diffusion pattern 102 for a minimum distance so that the transistor can function. The region of the gate pattern 104 extending beyond the diffusion pattern 102 is referred to as the poly end cap 106.

Figure 1B:
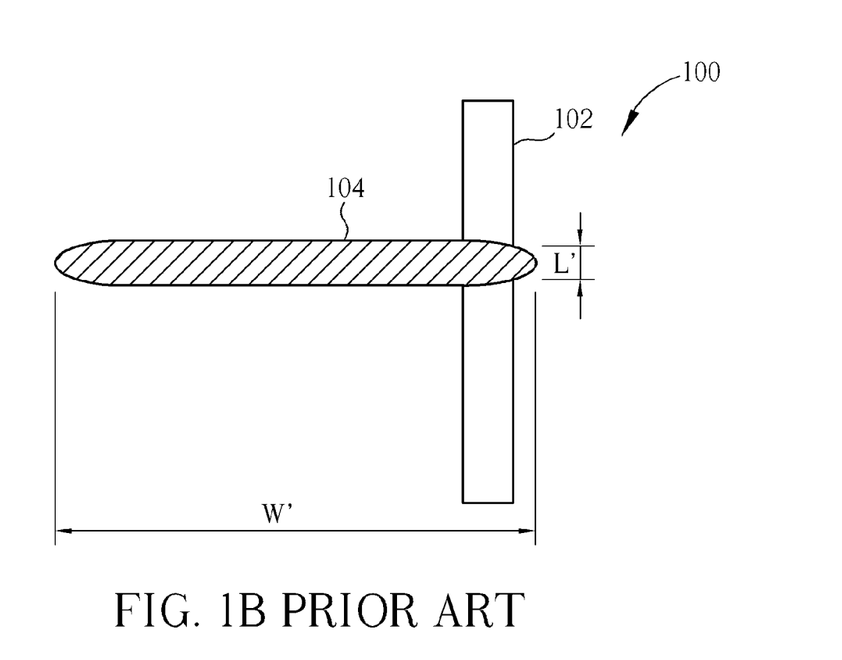
FIG. 1B shows a top-down view of the semiconductor device after forming the layout patterns.

Please refer to FIG. 1B, which shows a top-down view of the semiconductor device 100 after transferring the layout patterns to a substrate or and a layer. It is found that the transferred gate pattern 104 always suffers end shortening arising from optical effect and obtains a gate width W' shorter than the expected gate width W. Consequently, the device is adversely impacted by the gate width loss issue. Another consideration for the poly end cap 106 is the lithography capabilities in defining the lines and shapes near the poly ends: It is found that the poly end cap 106 is rounded as shown in FIG. 1B, instead of squared. The shortened and rounded poly end cap 106 results a channel length L' shorter than the expected channel length L, and consequently the device is adversely impacted by the channel length loss issue.

As semiconductor scaling continues, shortcomings of the conventional patterning due to optical effect as mentioned above limits the overall reliability and yield to semiconductor device. Therefore a method for forming semiconductor layout patterns having improved process window and thus the semiconductor device obtains improved reliability and yield are always in need.

SUMMARY OF THE INVENTION

According to an aspect of the present invention, a method for forming semiconductor layout patterns is provided. The method includes providing a pair of first layout patterns being symmetrical along an axial line, each of the first layout patterns comprising a first side proximal to the axial line and a second side far from the axial line; shifting a portion of the first layout patterns toward a direction opposite to the axial line to format least a first shifted portion in each first layout pattern, and outputting the first layout patterns and the first shifted portions on a first mask.

According to another aspect of the present invention, semiconductor layout patterns are provided. The semiconductor layout patterns include a pair of first layout patterns being symmetrical along an axial line, each of the first layout patterns comprising a first side proximal to the axial line and a second side far from the axial line, and a pair of second layout patterns being symmetrical along the axial line and perpendicular to the first layout patterns. Each of the first layout patterns further includes a first recessed region formed on the first side and a first bulged region formed on the second side, and the second layout pattern overlaps the first recessed region and the first bulged region.

According to still another aspect of the present invention, a semiconductor structure is provided. The semiconductor structure includes a pair of first diffusions being symmetrical along an axial line, and a pair of gate layers being symmetrical along the axial line and perpendicular to the first diffusions. Each of the first diffusions further includes a plurality of first straight-lined portions and at least a curved portion formed in between the first straight-lined portions. And the gate layers overlap the first curved portions, respectively.

According to the method for forming semiconductor layout patterns, the semiconductor layout patterns and the semiconductor structure provided by the present invention, the first layout patterns for forming the diffusions include the first shifted portions, such that the second layout patterns for forming the gate layers obtain larger end cap portions. Accordingly, the process window is improved and the end shorting and rounding effects no longer impact the products.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3-6 are schematic drawings illustrating a method for forming semiconductor layout patterns provided by the preferred embodiment of the present invention, wherein FIG. 4 is a schematic drawing in a step subsequent to FIG. 3, FIG. 5 is a schematic drawing in a step subsequent to FIG. 4, and FIG. 6 is a schematic drawing in a step subsequent to FIG. 5.

FIGS. 7 and 8 are schematic drawings illustrating steps for forming a semiconductor structure provided by the present invention, wherein FIG. 8 is a schematic drawing in a step subsequent to FIG. 7.

DETAILED DESCRIPTION

Figure 2:
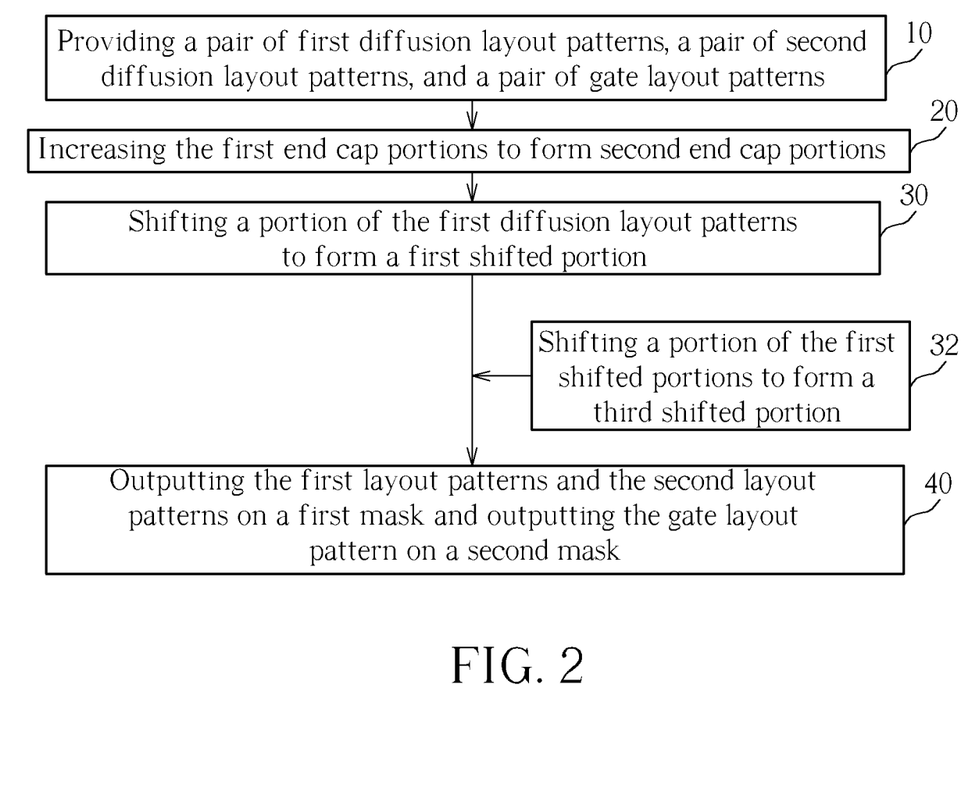
FIG. 2 is a flowchart of a method for forming semiconductor layout patterns provided by a preferred embodiment of the present invention.

Please refer to FIGS. 2-6, wherein FIG. 2 is a flowchart of a method for forming semiconductor layout patterns provided by a preferred embodiment of the present invention, and FIGS. 3-6 are schematic drawings illustrating the method for forming the semiconductor layout patterns provided by the preferred embodiment. As shown in FIG. 2, a Step 10 is performed:

STEP 10: providing a pair of first diffusion layout patterns 200, a pair of second diffusion layout patterns 210, and a pair of gate layout patterns 220.

Figure 3:
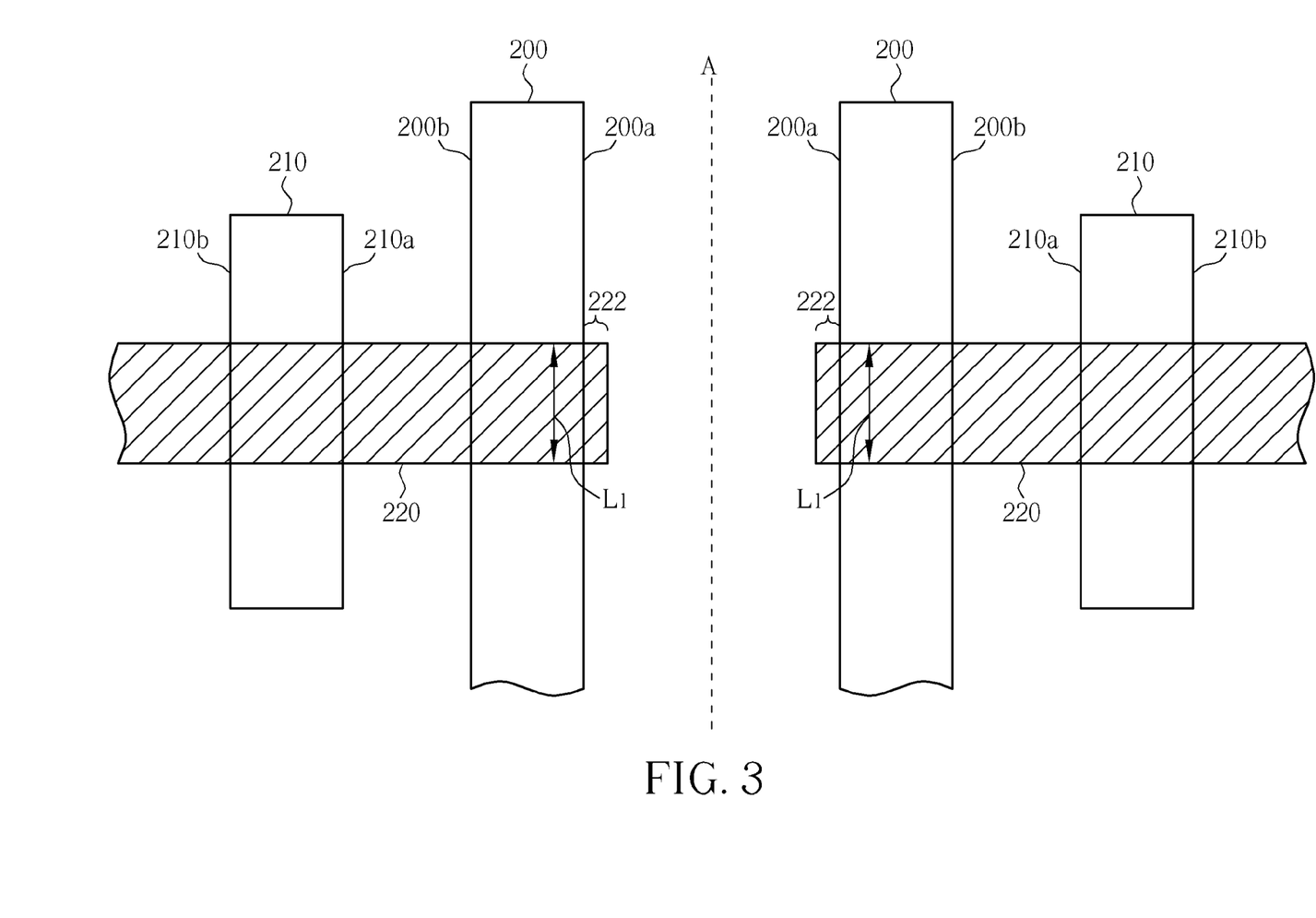

As shown in FIG. 3, a pair of the first layout patterns such as a pair of first diffusion layout patterns 200 is provided. And the first diffusion layout patterns 200 are symmetrical along an axial line A, thus a first side 200a proximal to the axial line A and a second side 200b far from the axial line A are defined in each of the first diffusion layout patterns 200. The preferred embodiment also provides a pair of second layout patterns such as a pair of second diffusion layout patterns 210. The second diffusion layout patterns 210 are also symmetrical along the axial line A and thus a first side 210a proximal to the axial line A and a second side 210b far from the axial line A are also defined in each of the second diffusion layout patterns 210. More important, the second diffusion layout patterns 210 are parallel with the first diffusion layout patterns 200 while the first diffusion layout patterns 200 are positioned in between the pair of second diffusion layout patterns 210 as shown in FIG. 3. The preferred embodiment further provides a pair of third layout patterns such as a pair of gate layout patterns 220. The gate layout patterns 220 are also symmetrical along the axial line A, but the gate layout patterns 220 are perpendicular to the first diffusion layout patterns 200 and the second diffusion layout patterns 210. Accordingly, each of the gate layout patterns 220 overlaps a portion of the first diffusion layout pattern 200 and a portion of the second diffusion layout pattern 210 on the same side of the axial line A. It is noteworthy that on the same side of the axial line A, each gate layout pattern 220 includes a portion extending beyond the first diffusion layout pattern 200 and such portion of the gate layout pattern 220 is referred to as an end cap portion. In other words, each of the gate layout patterns 220 include a first end cap portion 222 defined between the first diffusion layout pattern 200 and the axial line A as show in FIG. 3. Furthermore, an expected channel length $L_1$ is defined as shown in FIG. 3.

Figure 4:
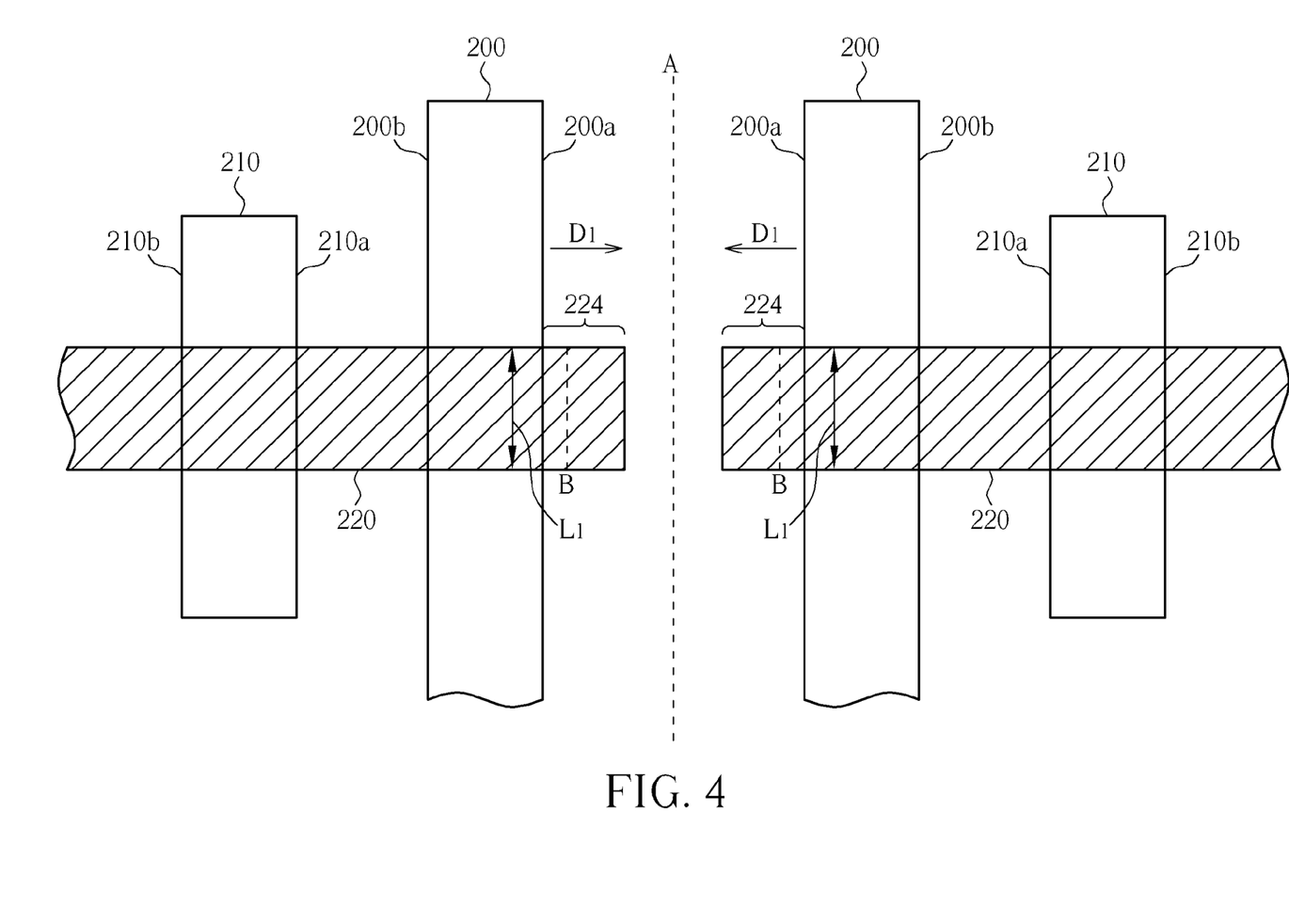

Please refer to FIGS. 2 and 4. Next, a step 20 is performed:

STEP 20: Increasing the first end cap portions 222 to form second end cap portions 224.

As shown in FIG. 4, each of the first end cap portions 222 are increased along a direction $D_1$ toward the axial line A, thus second end cap portions 224 larger than the first end cap portions 222 are obtained as shown in FIG. 4. It is noteworthy that Step 20 can be performed by an optical proximity correction (OPC). Please note that the dotted line B shows original edges of the first end cap portions 222 for emphasizing the differences between the second end cap portions 224 shown in FIG. 4 and the first end cap portions 212 shown in FIG. 3.

Figure 5:
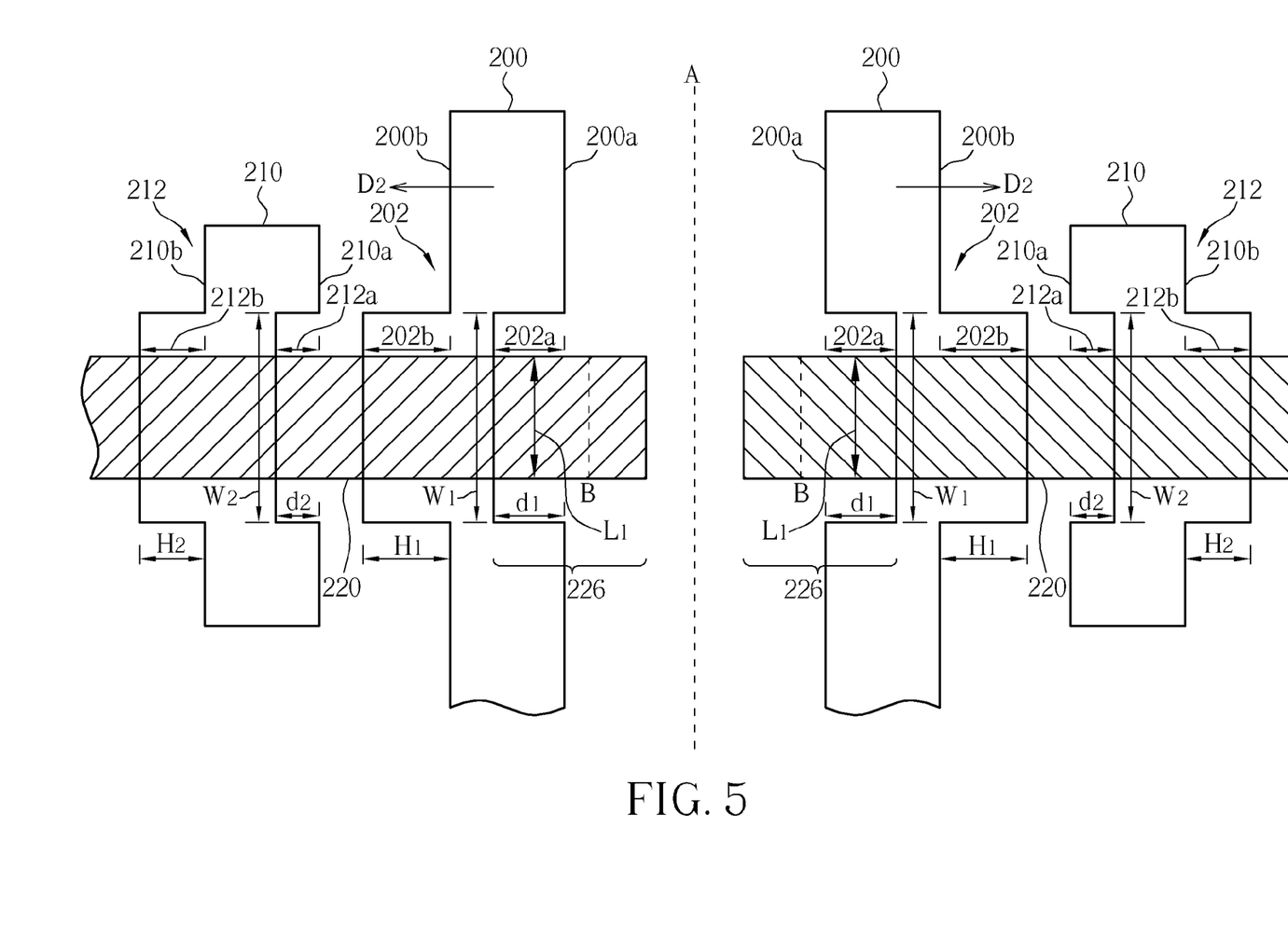

Please refer to FIGS. 2 and 5. After obtaining the second end cap portions 224, a step 30 is performed:

STEP 30: Shifting a portion of the first diffusion layout patterns 200 to form a first shifted portion 202.

As shown in FIG. 5, another OPC is performed to shift a portion of the first diffusion layout patterns 200 to form a first shifted portion 202 in each first diffusion layout pattern 200. It is noteworthy that the portions of the first diffusion layout patterns 200 are shifted along a direction $D_2$ opposite to the axial line A. The first shifted portions 202 are formed corresponding to the gate layout patterns 220, respectively. More important, a width $W_1$ of the first shifted portions 202 is larger than the channel length $L_1$. As shown in FIG. 5, each of the first shifted portions 202 includes a first recessed region 202a and a first bulged region 202b. In this preferred embodiment, a depth $d_1$ of the first recessed region 202a and a height $H_1$ of the first bulged region 202b are identical to each other. However, the depth $d_1$ of the first recessed region 202a and the height $H_1$ of the first bulged region 202b can be different if required. Accordingly, the second end cap portion 224 is further enlarged to form a third end cap portion 226 after forming the first shifted portions 202.

Additionally, the first shifted portions 202 can include only the bulged region 202b or only the recessed region 202a if required.

Please still refer to FIG. 5. Selectively, the OPC simultaneously shifts a portion of the second diffusion layout patterns 210 to form a second shifted portion 212 in each second diffusion layout pattern 210. In the same concept, the portions of the second diffusion layout patterns 210 are shifted along the direction $D_2$ opposite to the axial line A. The second shifted portions 212 are formed corresponding to the gate layout patterns 220 and to the first shifted portions 202. A width $W_2$ of the second shifted portions 212 is larger than the channel length $L_1$. The width $W_2$ of the second shifted portions 212 can even be larger than the width $W_1$ of the first shifted portions 202, if required. As shown in FIG. 5, each of the second shifted portions 212 in the second layout patterns 210 includes a second recessed region 212a and a second bulged region 212b. A depth $d_2$ of the second recessed region 212a and a height $H_2$ of the second bulged region 212b are identical to each other. However, the depth $d_2$ and the height $H_2$ can be different if required. Additionally, the depth $d_2$ of the second recessed region 212a and the height $H_2$ of the second bulged region 212b can be the same with or different from the depth $d_1$ of the first recessed region 202a and the height $H_1$ of the first bulged region 202b. In the same concept, the second shifted portions 212 can include only the bulged region 212b or only the recessed region 212a if required.

Figure 6:
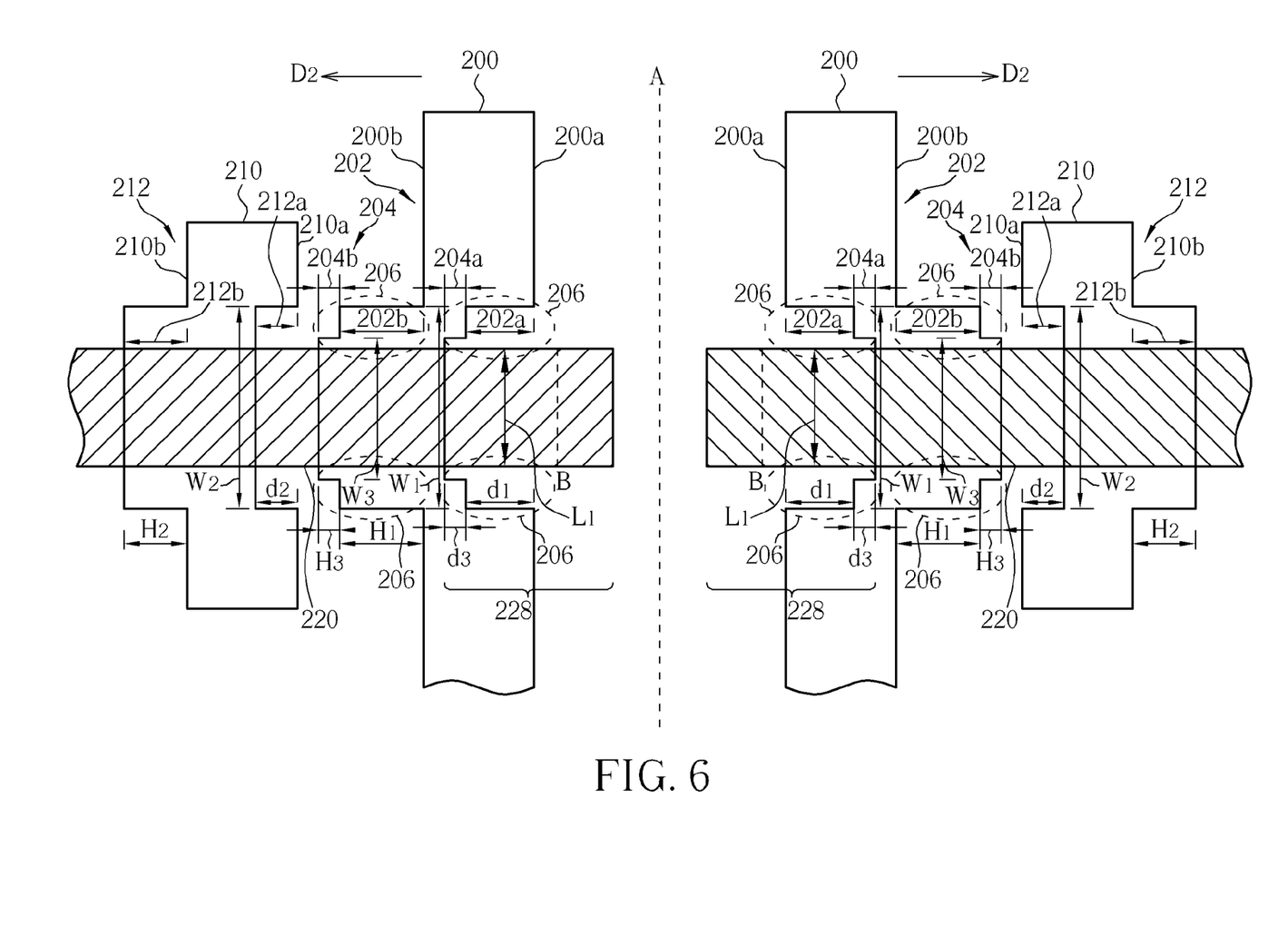

Please refer to FIGS. 2 and 6. After forming the first shifted portions 202 and selectively forming the second shifted portions 212, a step 32 is selectively performed:

STEP 32: Shifting a portion of the first shifted portions 202 to form a third shifted portion 204.

As shown in FIG. 6, the step 32 can be performed by another OPC: The OPC is performed to shift a portion of the first shifted portions 202 to forma third shifted portion 204 in each first shifted portion 202. It is noteworthy that the portions of the first diffusion layout patterns 202 are shifted along the direction $D_2$ opposite to the axial line A. More important, a width $W_3$ of the third shifted portions 204 is equal to or larger than the expected channel length $L_1$ but smaller than the first width $W_1$ of the first shifted portions 202. As shown in FIG. 6, each of the third shifted portions 204 includes a third recessed region 204a and a third bulged region 204b. However, the third shifted portions 204 can include only the bulged region 204b or only the recessed region 204a if required. In the preferred embodiment, the third recessed region 204a is formed in a bottom of the first recessed region 202a, and the third bulged region 204b is formed on a top of the first bulged region 202b. A depth $d_3$ of the third recessed region 204a and a height $H_3$ of the third bulged region 204b are identical to each other. However, the depth $d_3$ and the height $H_3$ can be different from each other if required. Furthermore, the depth $d_3$ of the third recessed region 204a and the height $H_3$ of the third bulged region 204b can be different from the depth $d_1$ of the first recessed region 202a and the height $H_1$ of the first bulged region 202b. More important, the third end cap portion 226 is further enlarged to form a fourth end cap portion 228 after forming the third shifted regions 204. Additionally, the first shifted portions 202 and the third shifted portions 204 form first step-liked portions 206 at the first side 200a and the second side 200b of the first layout patterns 200. The step-liked portions 206 are emphasized by Circle 206 in FIG. 6.

Selectively, the OPC can simultaneously shift a portion of the second shifted portions 212 to form other shifted portions as mentioned above, and those details are omitted for simplicity.

It is noteworthy that Step 32 can be repeated any number of time as required. Furthermore, it is conceivable that the more times the Step 32 being performed, the larger the end cap portions resulted. Furthermore, the gate layout patterns 220 overlap the first shifted portions 202, the second shifted portions 212, and the third shifted portions 204. In other words, the gate layout patterns 220 overlap all the shifted portions obtained by performing the above mentioned in Steps 30-32.

Please refer to FIG. 2. Then, a step 40 is performed:

STEP 40: Outputting the first diffusion layout patterns 200 and the second diffusion layout patterns 210 on a first mask and outputting the gate layout pattern 220 on a second mask.

It is noteworthy that after outputting the first diffusion layout patterns 200 and the second diffusion layout patterns 210 on the first mask and outputting the gate layout pattern 220 on second mask, different processes for forming a the semiconductor structure are performed. Please refer to FIGS. 7-8, which are schematic drawings illustrating steps for forming a semiconductor structure provided by the present invention. For example, a patterned mask (not shown) including the first diffusion layout patterns 200 (including the first shifted portions 202, the third shifted portions 204, and any other shifted portions if required) and the second diffusion layout patterns 210 (including the second shifted portions 212 and any other shifted portions if required) is transferred to a substrate 300 to form a pair of first diffusions 302 and a pair of second diffusions 304 by lithography. Specifically, the patterned mask can be transferred to the substrate 300 and expose areas excluding the first diffusion layout patterns 200 and the second diffusion layout patterns 210. Then the exposed areas are replaced by an insulator such as shallow trench isolation (STI) (not shown). Thus a pair of first active regions 302 and a pair of second active regions 304 are formed in the substrate 300 through the aforementioned patterned mask.

Figure 7:
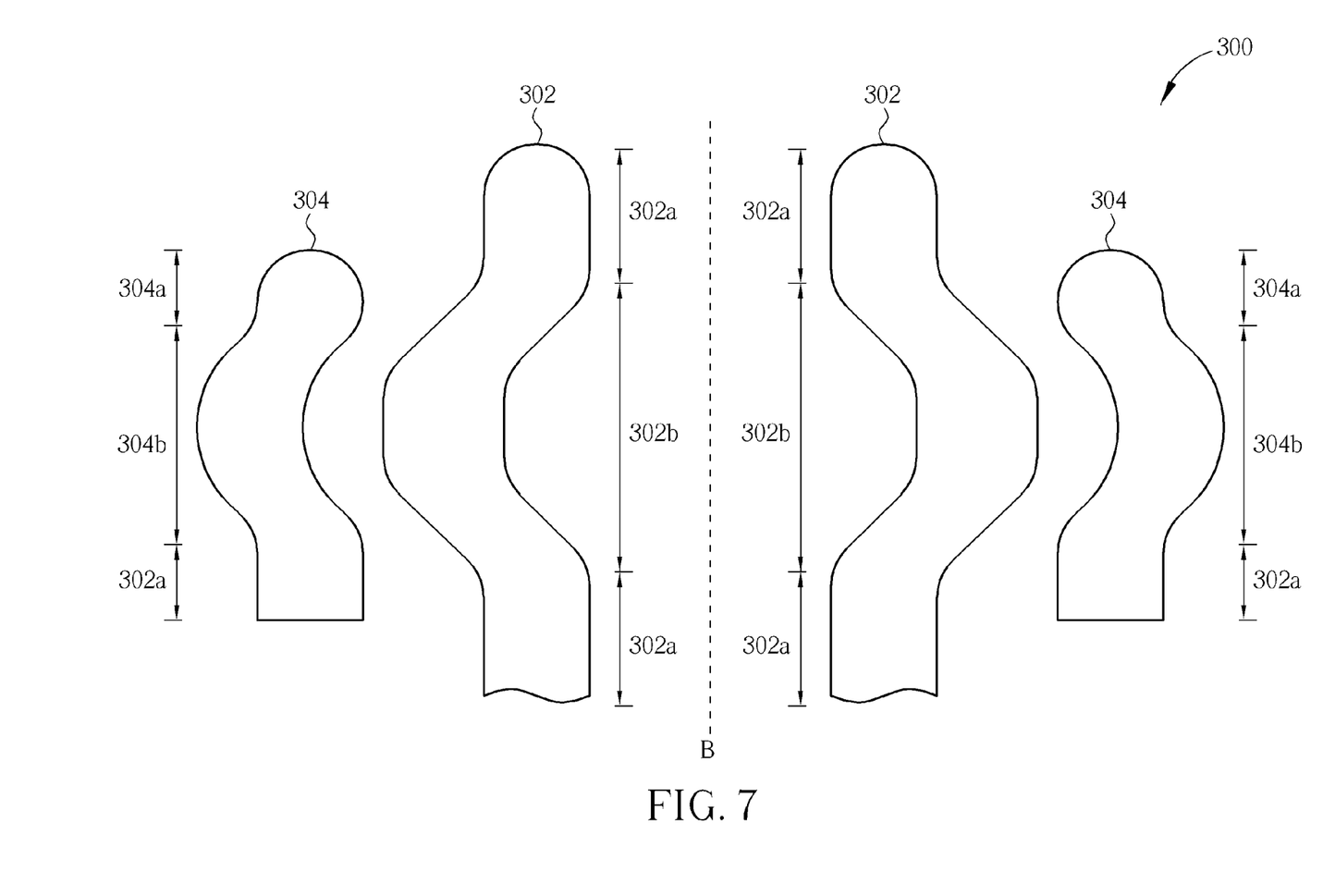

As shown in FIG. 7, the first diffusions 302 (or the first active regions) are symmetrical along an axial line B, and each of the first diffusions 302 further includes a plurality of first straight-lined portions 302a and at least a first curved portion 302b formed in between the first straight-lined portions 302a. The first straight-lined portions 302a and the first curved portions 302b are corresponding to the first diffusion layout patterns 200, but have smooth profiles because when transferring the first diffusion layout patterns 200 into the mask layer to form the patterned mask, squared corners are always rounded due to optical effect. Furthermore, it is conceivable the more shifted portions the first diffusion layout patterns 200 have, the smoother and more rounded the first curved portions 302b are. Also, the second diffusions 304 (or the second active regions) are symmetrical along an axial line B, and the first diffusions 302 are positioned in between the pair of second diffusions 304. Each of the second diffusions 304 further includes a plurality of second straight-lined portions 304a and at least a second curved portion 304b formed in between the second straight-lined portions 304a. In the same concept, the second straight-lined portions 304a and second curved portion 304b are corresponding to the second diffusion layout patterns 210, but have the smooth profiles.

Figure 8:
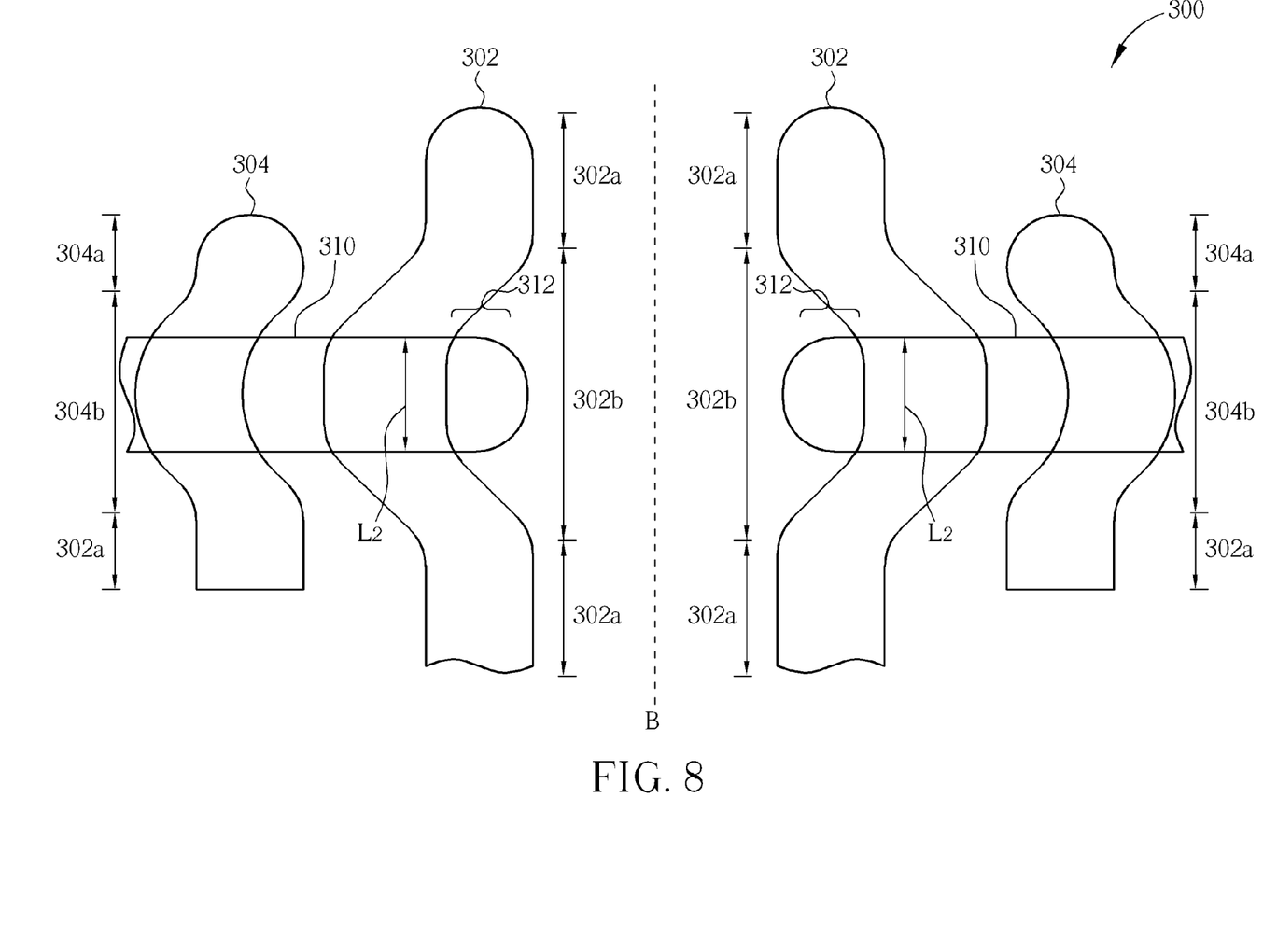

Please refer to FIG. 8. After forming the first diffusions 302 and the second diffusions 304, a conductive layer such as a polysilicon layer (not shown) and a hard mask layer (not shown) are sequentially formed on the substrate 300. Next, the gate layout patterns 220 are transferred to the hard mask layer to form a pattern hard mask and followed by performing a suitable etching process to further transfer the gate layout patterns to the polysilicon layer. Consequently, a pair of gate layers 310 being symmetrical along the axial line B and perpendicular to the first diffusions 302 and the second diffusions 304 are obtained. Furthermore, the gate layers 310 overlap the first curved portions 302b and the second curved portions 304b, respectively. As mentioned above, during transferring the gate layout patterns 220 to the hard mask layer, end shortening and rounding always occur due to optical effects. Therefore, the resulted gate layers 310 also obtain a smooth profile as shown in FIG. 8.

As shown in FIG. 8, portions of the gate layers 310 that extending beyond the first curved portion 302a are defined as end cap portions 312. It is noteworthy that by increasing the end cap portions in the gate layout pattern 220 and by forming the shifted portions 202/204 in the first diffusion layout patterns 200, the end cap portion is enlarged and thus the end shortening problem is compensated. In other words, the end shortening issue renders no impact to the final end cap portions 312. More important, the channel length $L_2$ as shown in FIG. 8 is equal to the expected channel length $L_1$, thus the channel length loss is also eliminated.

According to the method for forming semiconductor layout patterns, the semiconductor layout patterns and the semiconductor structure provided by the present invention, the first layout patterns for forming the diffusion include the first shifted portion obtained by the method, such that the second layout patterns for forming the gate layer obtain a larger end cap portions. Accordingly, the process window is improved and the end shorting and rounding effects no longer impact the devices.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming semiconductor layout patterns, comprising:

providing a pair of first layout patterns and a pair of third layout patterns being symmetrical along an axial line, each of the first layout patterns comprising a first side proximal to the axial line and a second side far from to the axial line, the third layout patterns being perpendicular to the first layout patterns;

shifting a portion of the first layout patterns toward a direction opposite to the axial line to form at least a first shifted portion in each first layout pattern, and a portion of the third layout patterns overlapping the first shifted portions; and outputting the first layout patterns and the first shifted portions on a first mask.

2. The method for forming semiconductor layout patterns according to claim 1, wherein the first shifted portion comprises a first recessed region and a first bulged region.

3. The method for forming semiconductor layout patterns according to claim 2, wherein a depth of the first recessed region and a height of the first bulged region are identical to each other.

4. The method for forming semiconductor layout patterns according to claim 1, further comprising shifting a portion of the first shifted region to form a second shifted region in each first shifted region.

5. The method for forming semiconductor layout patterns according to claim 4, wherein the second shifted portion comprises a second recessed region and a second bulged region, and a depth of the second recessed region and a height of the second bulged region are identical to each other.

6. The method for forming semiconductor layout patterns according to claim 4, wherein the first shifted portion and the second shifted portion form a step-liked portion at the first side and the second side of the first layout patterns.

7. The method for forming semiconductor layout patterns according to claim 1, further comprising a pair of second layout patterns being symmetrical along the axial line, and the first layout patterns being positioned in between the second layout patterns.

8. The method for forming semiconductor layout patterns according to claim 7, further comprising shifting a portion of the second layout pattern to form a third shifted portion in each second layout pattern, and the third shifted portions are corresponding to the first shifted portions.

9. The method for forming semiconductor layout patterns according to claim 7, further comprising outputting the second layout pattern to the first mask.

10. The method for forming semiconductor layout patterns according to claim 1, wherein the third layout pattern comprises an end cap portion defined between the first layout pattern and the axial line.

11. The method for forming semiconductor layout patterns according to claim 10, further comprising increasing the end cap portion along a direction toward the axial line before shifting the first layout patterns.

12. The method for forming semiconductor layout patterns according to claim 1, further comprising outputting the third layout pattern to a second mask.

* * * * *